US008087922B2

(12) United States Patent
Zhang et al.

(10) Patent No.: US 8,087,922 B2
(45) Date of Patent: Jan. 3, 2012

(54) IMPRINT LITHOGRAPHY WITH IMPROVED SUBSTRATE/MOLD SEPARATION

(76) Inventors: Wei Zhang, Plainsboro, NJ (US); Hua Tan, Princeton Junction, NJ (US); Lin Hu, Livingston, NJ (US); Stephen Y. Chou, Princeton, NJ (US)

( * ) Notice: Subject to any disclaimer, the term of this patent is extended or adjusted under 35 U.S.C. 154(b) by 0 days.

(21) Appl. No.: 12/691,202

(22) Filed: Jan. 21, 2010

(65) Prior Publication Data
US 2010/0119641 A1    May 13, 2010

Related U.S. Application Data

(62) Division of application No. 11/945,033, filed on Nov. 26, 2007.

(60) Provisional application No. 60/867,519, filed on Nov. 28, 2006.

(51) Int. Cl.
*B29C 59/00*    (2006.01)
*B28B 7/10*    (2006.01)

(52) U.S. Cl. ............. 425/385; 425/436 R; 425/436 RM; 264/293

(58) Field of Classification Search .................. 425/385, 425/436 R, 437, 436 RM; 264/293
See application file for complete search history.

(56) References Cited

U.S. PATENT DOCUMENTS

2005/0116370 A1 *  6/2005  Ogino et al. ................. 264/40.1
2007/0205524 A1 *  9/2007  Best et al. ..................... 264/1.1

* cited by examiner

*Primary Examiner* — Maria Veronica Ewald
(74) *Attorney, Agent, or Firm* — Polster, Lieder, Woodruff & Lucchesi, LC

(57) ABSTRACT

In imprint lithography, a mold having a pattern of projecting and recessed regions is pressed into a moldable surface on a substrate. The thus-imprinted moldable surface is permitted to at least partially harden to retain the imprint, and the substrate and mold are separated. In accordance with the invention, the substrate is separated from the mold by bending laterally distal regions (regions away from the center toward the edges) of the mold transversely away from the interface and transversely restraining the substrate. The mold can then be easily separated from the substrate by transverse displacement. The separation can be facilitated by providing a mold having a lateral dimension that on at least two sides extends beyond the corresponding lateral dimension of the substrate. Alternatively, the substrate can have a greater lateral extent than the mold, and the mold can be restrained. The distal regions of the substrate can be bent in the transverse direction. Apparatus for effecting such separation is also described.

20 Claims, 10 Drawing Sheets

IMPRINT LITHOGRAPHY WITH IMPROVED SUBSTRATE/MOLD SEPARATION

CROSS-REFERENCE TO RELATED APPLICATIONS

The present application claims priority from, and is a Divisional of, co-pending U.S. patent application Ser. No. 11/945,033 filed on Nov. 26, 2007, which in turn claims the benefit of U.S. Provisional Application Ser. No. 60/867,519 filed on Nov. 28, 2006, both of which are incorporated herein by reference.

STATEMENT REGARDING FEDERALLY SPONSORED RESEARCH

Not Applicable.

FIELD OF THE INVENTION

This invention relates to imprint lithography, and in particular, to imprint lithography with improved methods and apparatus for separating the imprinted substrate from the mold.

BACKGROUND OF THE INVENTION

Lithography is a key process in the fabrication of semiconductor integrated circuits and many optical, magnetic, biological, and micromechanical devices. Lithography creates a pattern on a substrate-supported moldable film so that, in subsequent process steps, the pattern can be replicated in the substrate or in another material that is added onto the substrate.

Conventional lithography, referred to as photolithography, involves applying a thin film of photosensitive resist to a substrate, exposing the resist to a desired pattern of radiation and developing the exposed resist to produce a physical pattern on the substrate. The resolution of patterns produced by photolithography is limited by the wavelength of the exposing radiation. Moreover, as pattern features become smaller, increasingly expensive shorter wavelength equipment is required.

Imprint lithography, based on a fundamentally different principle, offers high resolution, high throughput, low cost and the potential of large area coverage. In imprint lithography, a mold with a pattern of projecting and recessed features is pressed into a moldable surface, typically a thin film, deforming the shape of the film and forming a relief pattern in the film. The film is hardened, as by UV or thermal curing, and the mold and imprinted substrate are separated. After the mold is removed, the residual reduced thickness portions of the film can be removed to expose the underlying substrate for further processing. Imprint lithography can be used to replicate patterns having high resolution features in the microscale and nanoscale ranges. Details of nanoscale imprint lithography ("nanoimprint lithography") are described in U.S. Pat. No. 5,772,905 issued Jun. 30, 1998 and entitled "Nanoimprint Lithography". The '905 patent is incorporated herein by reference.

A potential limitation on the throughput of manufacturing using imprint lithography is the time required for separating the mold and the substrate. Typically, the mold and substrate are mechanically separated from the edge by inserting a wedge between the mold and substrate. This edge separation typically requires transporting the mold/substrate assembly from the pressing apparatus to the separation apparatus, thus, limiting throughput of imprinting. Furthermore, this edge separation deteriorates the mold, which, in turn, increases operation cost and limits throughput.

Accordingly, it would be highly desirable to provide improved methods and apparatus for separation in imprint lithography.

BRIEF SUMMARY OF THE INVENTION

In imprint lithography, a mold having a pattern of projecting and recessed regions is pressed into a moldable surface on a substrate. The thus-imprinted moldable surface is permitted to at least partially harden to retain the imprint, and the substrate and mold are separated. In accordance with the invention, the substrate is separated from the mold by bending laterally distal regions (regions away from the center toward the edges) of the mold transversely away from the interface and transversely restraining the substrate. The mold can then be easily separated from the substrate by transverse displacement. The separation can be facilitated by providing a mold having a lateral dimension that on at least two sides extends beyond the corresponding lateral dimension of the substrate. Alternatively, the substrate can have a greater lateral extent than the mold, and the mold can be restrained. The distal regions of the substrate can be bent in the transverse direction. Apparatus for effecting such separation is also described.

BRIEF DESCRIPTION OF THE DRAWINGS

The advantages, nature and various additional features of the invention will appear more fully upon consideration of the illustrative embodiments now to be described in detail in connection with the accompanying drawings.

In the drawings.

It is to be understood that these drawings are for the purpose of illustrating the concepts of the invention and are not to scale.

DETAILED DESCRIPTION OF THE INVENTION

Figure 1:
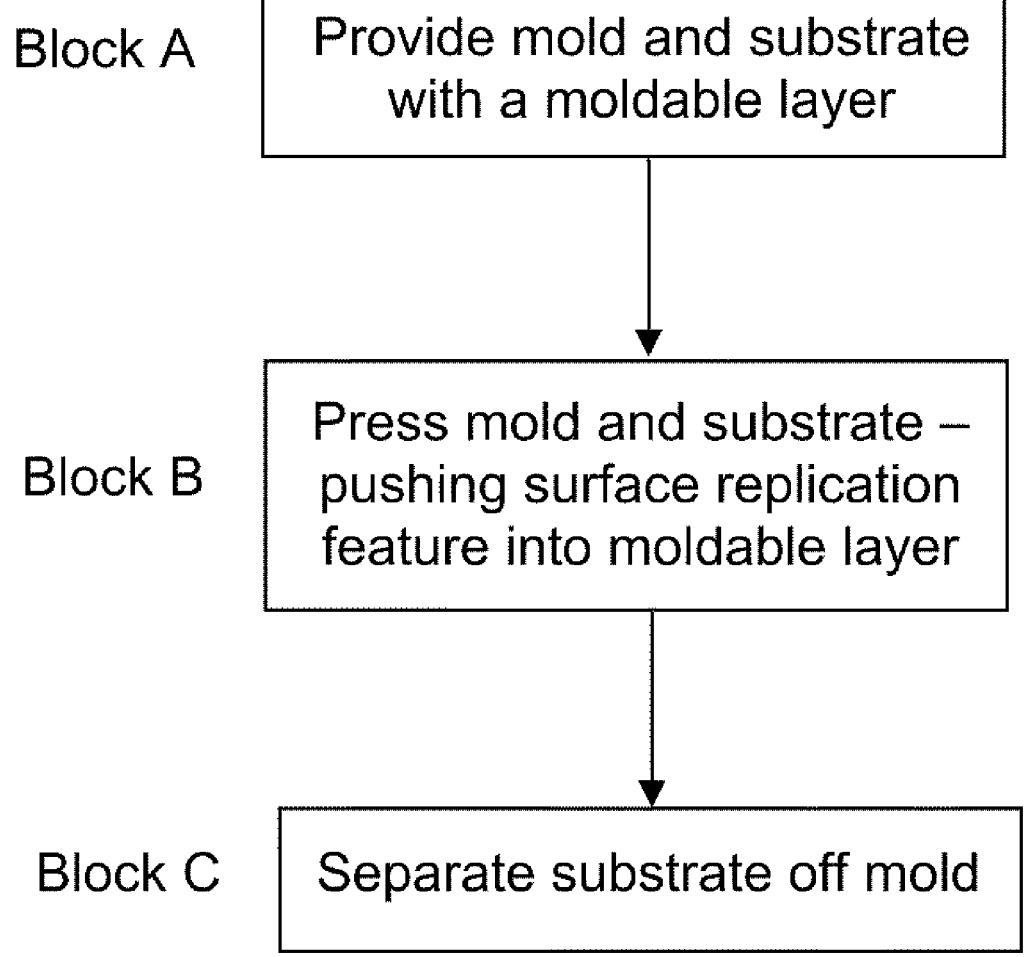
FIG. 1 is a flow chart schematically illustrating conventional imprint lithography.

Referring to the drawings, FIG. 1 is a schematic block diagram of conventional imprint lithography. An initial step shown in block A is to provide a patterned mold and a substrate with a moldable surface. Typically, a moldable polymer layer is applied as a thin film on the substrate as by spinning, dropping or deposition. The mold has a topological surface variation that includes features to be replicated into the moldable polymer by imprinting. An anti-sticking layer is generally coated on the molding surface in order to facilitate surface release.

Depending on the polymer used, imprint lithography can be divided into thermal imprint lithography and UV (ultraviolet light) imprint lithography. Thermal imprint lithography uses thermal plastic polymer or thermal curable polymer as resist. UV imprint lithography uses UV curable polymer. Thermal and UV imprint lithography are similar in process except the way they manipulate the polymer flowing capability.

The next step, shown in Block B of FIG. 1, is to press the mold and the substrate together; and to permit the imprinted moldable surface to harden or partially harden. For imprinting a thermal plastic polymer, it is desirable before imprinting to heat the polymer above its plastic transition temperature to a flow state. Thermally curable polymers and UV curable polymers are typically liquid before they are set or cured.

After the surface replication features are pressed into the moldable polymer layer, the polymer should be permitted to at least partially harden to become non-deformable. A thermal plastic polymer is hardened by cooling the polymer below its plastic transition temperature. Thermally curable polymer is hardened by heating. UV curable polymer is hardened by initiating molecular cross-linking by UV radiation.

The third step (FIG. 1, Block C) is to separate the substrate from the mold. The mold typically has a surface anti-sticking coating to promote clean separation of the moldable layer from the mold surface. The substrate typically has a stronger surface adhesion to the moldable layer than the moldable layer has to the mold. To this end, the substrate may be adhered the moldable layer by an adhesive coating.

After separation, the substrate may be further processed as by etching to remove residual polymer layer underneath recessed areas of the imprinted pattern (not shown in FIG. 1). Further details of imprint lithography are described in U.S. Pat. No. 5,772,905 issued Jun. 30, 1998 which is incorporated herein by reference.

In accordance with the invention, the substrate is separated from the mold by applying to one of the two components (mold or substrate) bending forces transversely away from the interface on laterally distal regions (e.g. edges away from the center) and restraining the other component (substrate or mold). This method of separation can be better understood by consideration of FIGS. 2 and 3.

Figure 2:
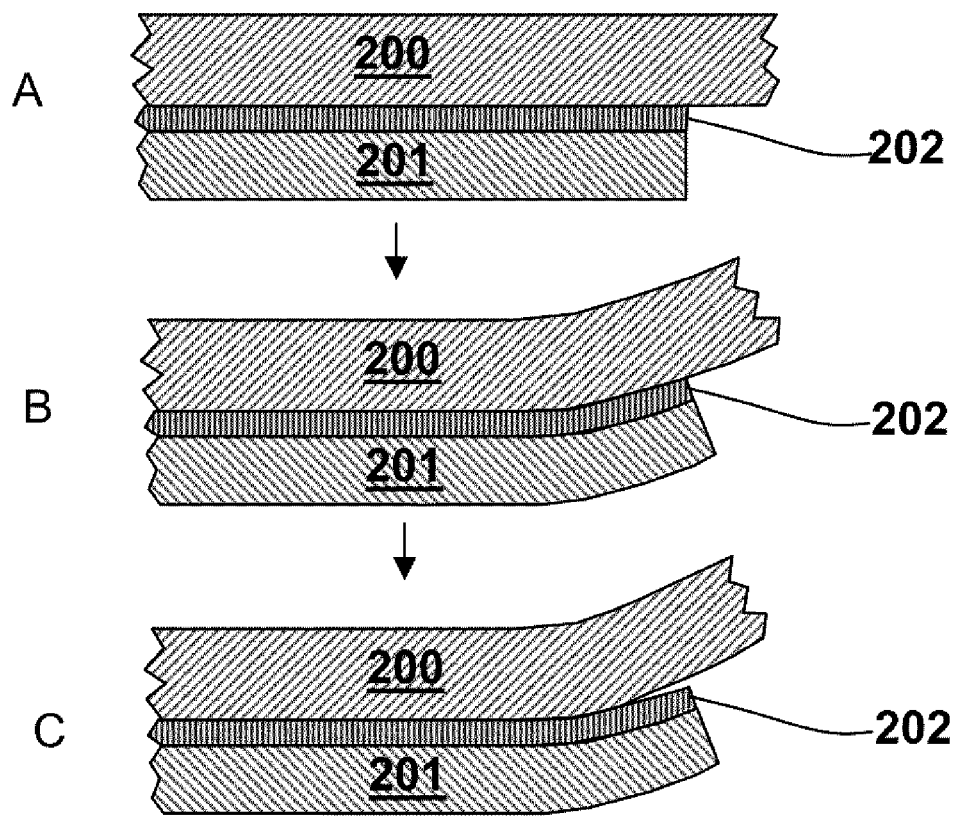
FIG. 2 illustrates edge separation via bending.

FIG. 2 illustrates how application of bending force to a laterally distal region away from the center of a mold can initiate separation. Assume that mold 200 and substrate 201 were previously pressed together and that polymer layer 202 has been imprinted and at least partially hardened to retain the imprint. The two components (200, 201), as shown in FIG. 2A, need to be separated. When mold 200 is bent at a distal region, as shown in FIG. 2B, a distal region of substrate 201 will follow the bending curvature of the mold due to surface adhesion. Internal stress will be generated inside mold 200 and inside substrate 201 at the adhering boundary surface. The stresses have a tendency to restore the mold 200 and substrate 201 to their unbent condition. When the bending of mold 200 is further increased as shown in FIG. 2C, the stress of the edge of substrate 201 will overcome the surface adhesion. The substrate will then withdraw from surface of mold 200 at the substrate edge. Since mold 200 typically has a release coating in its surface, and the polymer 202 is adhered to the substrate, the polymer will stay on the substrate and separate from the mold.

Figure 3:
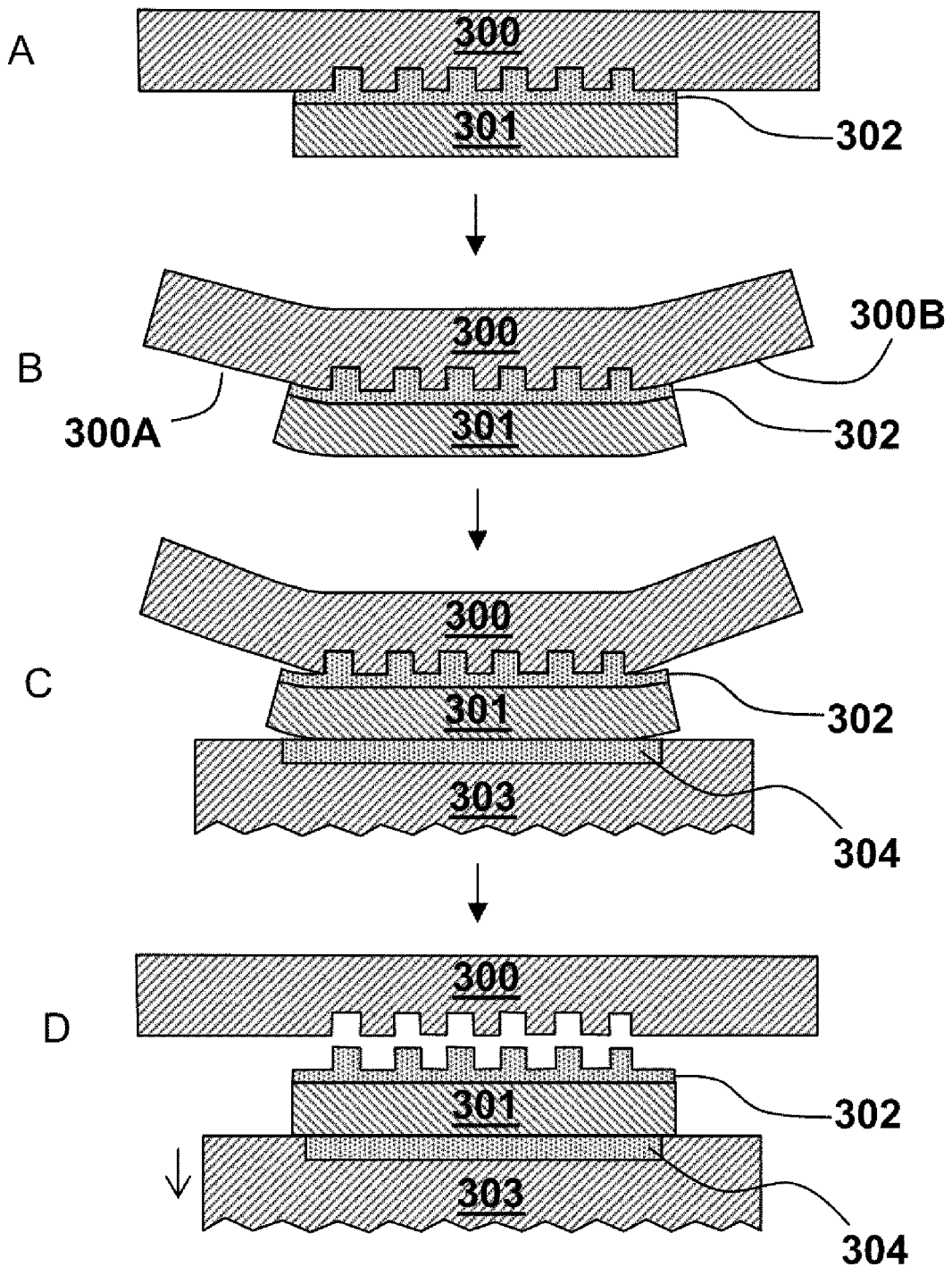
FIG. 3 shows a substrate and mold at various stages during separation in accordance with the invention.

FIG. 3 now shows how complete separation can be attained for a mold 300 and substrate 301 that have been processed together. Referring to FIG. 3A, the replication features on mold 300 have been filled with polymer 302 by pressing, and the polymer is hardened or partially hardened. One component, e.g. mold 300, is laterally more extensive than the other component, e.g. substrate 301. Mold 300 is then bent at one or more distal regions 300A, 300B as shown in FIG. 3B. Substrate 301 will follow the bending curvature at its edge since surface adhesion holds the substrate 301 together with the mold 300. A stress is generated in the substrate 301 and at the boundary surface between the mold and the substrate. The stress tends to restore the substrate. However, surface adhesion prevents the restoration. When the bending of the mold 300 is increased, as shown in FIG. 3C, the surface adhesion is no longer able to prevent restoration of the substrate. Substrate 301 withdraws from contact with the mold surface at each edge. An initial separation at the edges is thus obtained.

The next step, shown in FIG. 3D, is to restrain one of the two components (300, 301), e.g. the substrate, and to transversely separate the mold and substrate. The substrate 301 can be transversely restrained by fixture 303 with vacuuming area 304 applied to the back surface of the substrate. Vacuuming area 304 can cover the medial surface area of substrate 301 almost completely, extending to a small distance from edge of the substrate 301. The vacuuming force on area 304 will facilitate separation of substrate 301 from mold 300 by generating additional pressure difference. The separation generated by bending will be extended toward center by the vacuuming force. Air filling the recently separated region will further extend the region of separation. The separated edge will move toward center until whole area of substrate 301 is separated from surface of mold 300.

Fixture 303 or mold 300 may be displaced transversely to facilitate the extension of separation. Substrate 301 can be held securely on fixture 303 by vacuuming to move together with the fixture. At end of process, substrate 301 is completely separated from mold 300 and is withdrawn away.

Figure 4:
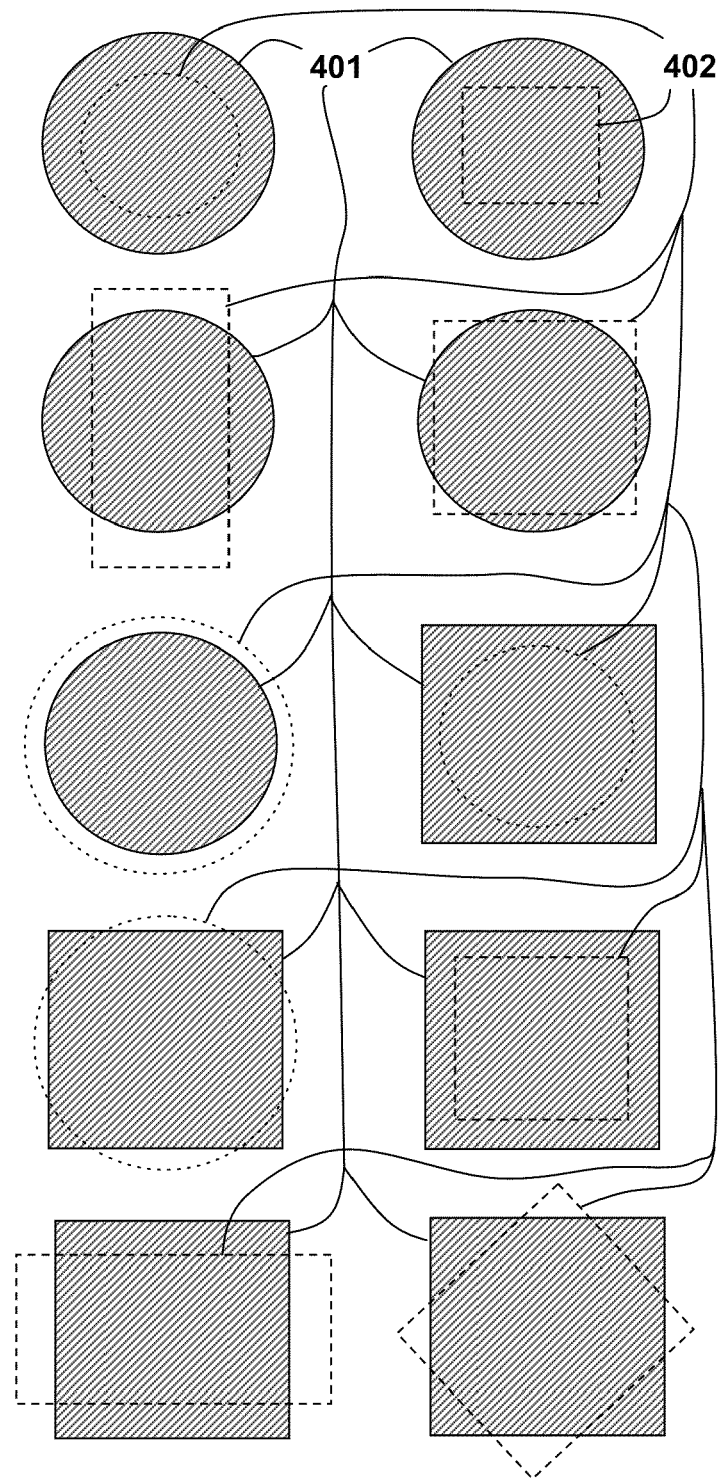
FIG. 4 illustrates various configurations of mold and substrate for separation in accordance with the invention.

Alternatively, the substrate edges can be bent and the mold restrained. Vacuum force on backside surface of the mold 300 may optionally be used to further facilitate the extension of separation. The substrate can be transversely withdrawn There are no special requirements regarding replication features on the mold or the fabrication process of the mold. However, the materials and thicknesses of the mold and the substrate advantageously are chosen to have mechanical bending properties that will promote separation by bending. The material should be bendable under a reasonable force and should generate suitable stress by bending to overcome the surface adhesion for initial edge separation. Furthermore, either the mold or the substrate advantageously has areas that extend laterally beyond the other that can be contacted by a bending force generator. Thus, either the mold or the substrate is advantageously laterally larger than the other. FIG. 4 illustrates various advantageous combination configurations of molds 401 and substrates 402.

Figure 5:
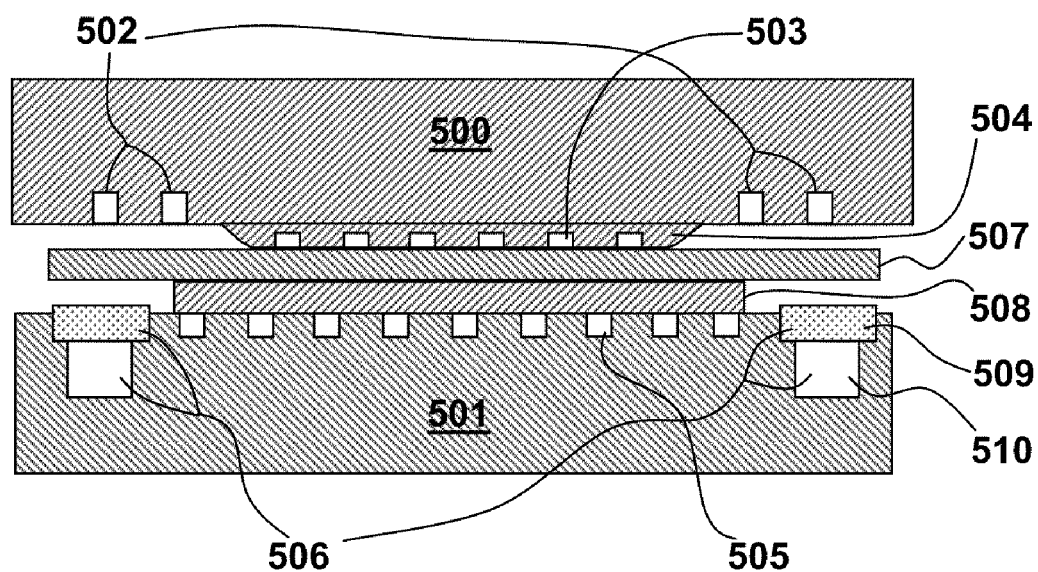
FIG. 5 shows apparatus using a surface plateau to control bending precisely.

FIG. 5 shows advantageous apparatus for practicing the above-described method of separation. Two fixtures 500 and 501 are disposed to face each other. Fixture 500 has a surface plateau 504, vacuuming grooves 503 on the plateau, and vacuuming grooves 502 on the non-plateau surface. Under vacuum, grooves 503 retain the mold 507 and grooves 502 hold bent edges of the mold. Fixture 501 has vacuum grooves 505, and pushing elements 506. Under vacuum, grooves 505 retain the substrate 508. Upon actuation, elements 506 bend the mold.

An assembly of mold 507 and substrate 508, which were pressed together, is held between the two fixtures. Vacuum is applied to grooves 505 and grooves 503. Pushing elements 506 are charged to push against mold 507 to bend it near its distal edges. Vacuum is applied to groves 502 to hold edge areas of mold 507 from the mold backside. The vacuum on grooves 503 pulls the edge area of mold 507 toward fixture 500. The bending generated by pushing element 506 will reduce the gap between mold 507 and fixture 500 without severe air leakage at edge.

Once the vacuum to grooves 502 is effectively established, pushing elements 506 may be relaxed from pushing against mold 507. The edges of mold 507 will still be held by vacuum to grooves 502. The plateau height, relative position of plateau and the edge of the substrate determine the amplitude of edge bending of mold precisely and consistently. The vacuum to grooves 502 urges bending without hard contact.

Edge separation is generated by bending the mold. Vacuum on grooves 502 may be either kept on or turned off. Finally, withdrawing fixture 500 away from fixture 501 along a direction perpendicular to the contacting surface of the mold and substrate separates the substrate and the mold and holds them separate. During this step, vacuum to grooves 503 fixes mold 507 against fixture 500, and vacuum to grooves 505 fixes substrate 508 against fixture 501. The combined effect of the vacuum and the withdrawing of the fixture causes the initial separation at the edges to propagate toward the center until the whole substrate is released from the mold.

The pushing element shown in FIG. 5 may be a single actuator or multiple actuators. An actuator for pushing may be a hydraulic piston, solenoid, inflatable sealed membrane, spring or the direct flow of fluid. In FIG. 5, the actuator shown is an inflatable sealed membrane actuator comprising a membrane 509 and a cavity 510. When cavity 510 is pressurized with a fluid such as nitrogen gas, membrane 509 inflates and pushes against the mold. The membrane actuator advantageously has a ring or square shape, depending upon the shapes of the substrate and the mold, to apply uniform force around the periphery of the mold.

In this description, the mold is specified as larger than the substrate. Alternatively, the substrate could be larger than the mold and the bending force could be applied to the larger substrate. Thus, the 507 and 508 could alternatively designate the substrate and mold respectively.

Figure 6:
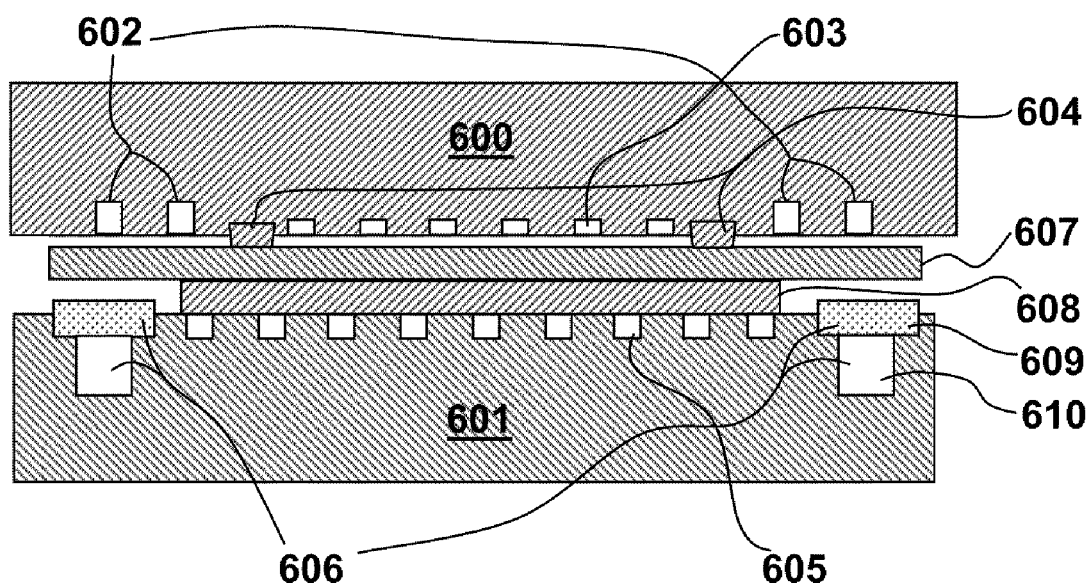
FIG. 6 illustrates apparatus using a surface extruded feature to control bending precisely.

FIG. 6 shows alternative apparatus for practicing the separation method. Two fixtures 600 and 601 are disposed to face each other. Fixture 600 has a surface projecting feature 604, vacuum grooves 603 enclosed by the projecting feature, and vacuum grooves 602 outside the projecting feature. Fixture 601 has vacuum grooves 605 and pushing element(s) 606. The projecting feature has a fixed or adjustable projecting height from the surface of fixture 600.

An assembly of mold 607 and substrate 608, which were previously pressed together, is held between the two fixtures. Vacuum is applied to grooves 605 and to grooves 603. Pushing element 606 is charged to push against mold 607 and to bend the mold at its edges. Vacuum is applied on grooves 602 to hold the bent mold edge areas. The vacuum to grooves 602 pulls the mold edge area toward fixture 600. The bending generated by pushing element 606 reduces the gap between the edges of mold 607 and the fixture 600. Thus, vacuum to grooves 602 can hold the mold edge area without severe air leakage.

Once the vacuum to grooves 602 is effectively established, the pushing element 606 may be relaxed. However, the edges of mold 607 will still be held by vacuum to grooves 602. The precise height of the projecting feature and the relative position of the projecting feature and the edge of the substrate determine the amplitude of mold edge bending precisely and consistently. The vacuum to grooves 602 urges bending without hard contact. Therefore, mold is protected from permanent over-bending.

Edge separation is generated by bending the mold. Vacuum on grooves 602 may be either kept on or turned off. Finally, withdrawing relatively fixture 600 away from fixture 601 along a transverse direction perpendicular to the contacting surface of the mold and substrate can separate the substrate the mold and hold them separate. During this step, vacuum to grooves 603 fixes mold 607 against fixture 600, and vacuum to grooves 605 fixes substrate 608 against fixture 601. The combined effect of the vacuum and the withdrawing causes the initial separation at the edges to propagate toward the center until the whole substrate is released from the mold surface.

The pushing element shown in FIG. 6 may be a single actuator or multiple actuators. The actuator for pushing may be a hydraulic piston, solenoid, inflatable sealed membrane, spring or direct flow of fluid. In drawing of FIG. 6, a sealed membrane actuator comprises a membrane 609 and a cavity 610. When cavity 610 is pressurized with fluid such as nitrogen gas, membrane 609 is inflated and pushes against the mold. The membrane actuator advantageously has a ring-shape or square shape, depending upon the shapes of the substrate and the mold, to form a uniform urging around the periphery of mold. In FIG. 6, the mold is shown larger than the substrate. Alternatively, the substrate could be larger than the mold and the pushing could be applied to bend the substrate rather than the mold. Thus, the 607 and 608 could alternatively designate the substrate and mold respectively.

Figure 7:
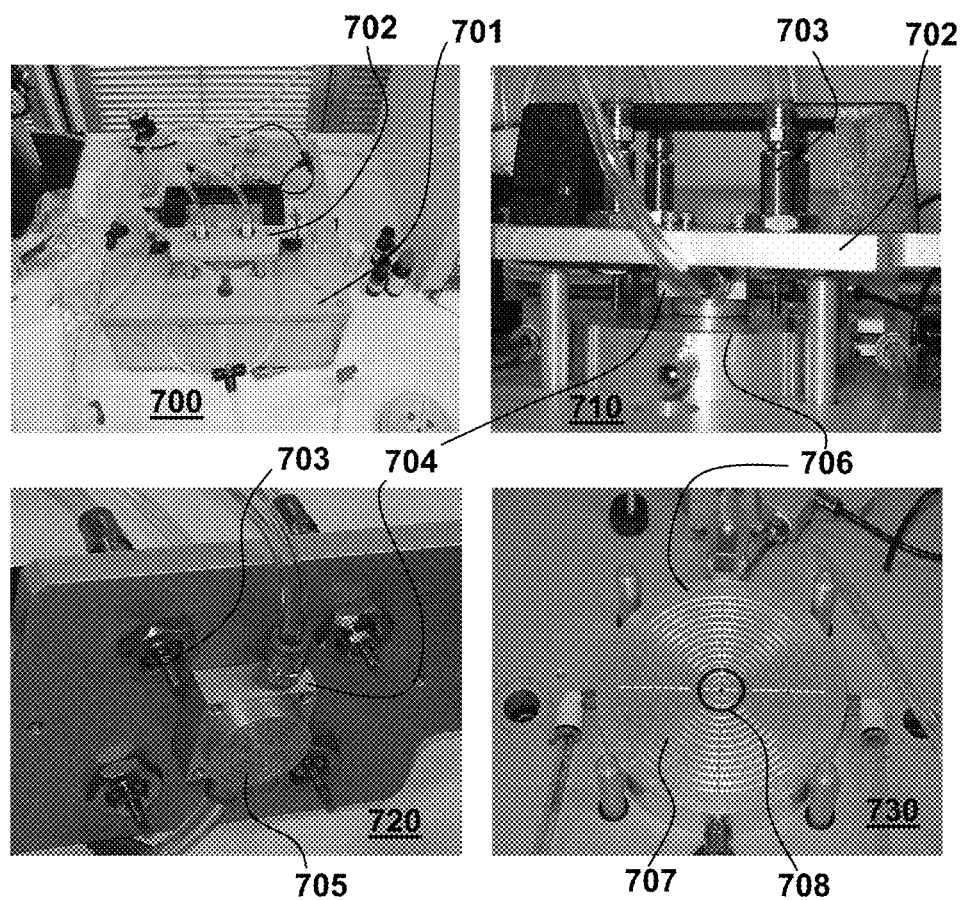
FIG. 7 shows photographs of an experimental setup used to demonstrate the invention.

The invention can now be more clearly understood by consideration of the following experimental demonstration. The experimental setup, similar to the design of illustration of FIG. 6, is photographically depicted in FIG. 7, photo 700. The setup comprises base fixture 701 and a top fixture 702. Photo 710 shows an enlarged view of core part of the setup, wherein vacuum grooves and the pushing element are seen clearly. Photo 720 shows an enlarged view of one side of top fixture 702. The pushing element in the setup consists of four pen-type pistons 703 with pushing rods. The pistons have a spring-return and a gas connector on one end. A small chuck 704 is attached to a base plate of top fixture to hold the substrate by vacuum. Photo 730 shows an enlarged view of the top surface of bottom fixture 701. A large chuck 706 is attached to the base plate of the bottom fixture to hold the mold by vacuum. The vacuum grooves on the chucks are designated 705 and 707 respectively. O-ring 708 shown in photo 730 depicts the projecting feature of FIG. 6. The O-ring is smaller than the substrate 27 millimeters O.D. and about 1-2 millimeters above the surface of the chuck.

The substrate used in the experiment was a thin quartz circular substrate of 27 millimeters O.D. and thickness of about 0.4 millimeters. The mold was a quartz wafer of O.D. 4 inches and thickness about 0.5 millimeters. The chucks and the vacuum grooves were made according to the substrate and the mold. In the experiment, the mold and the substrate were imprinted on an imprinting tool. The assembly of imprinted mold and substrate was transported from the tool and loaded on the experimental setup with the substrate against the top fixture chuck and the mold against the bottom fixture chuck. Vacuum was applied to grooves 705 to hold the substrate against the top chuck. Pressurizing actuators 703 with nitrogen gas pushed the mold at the edges against surface of bottom chuck. The bending caused the edge of the substrate to release from the mold surface. Such bending could be repeated several times by alternately pressurizing and depressurizing the actuators. Vacuum was applied to grooves 707. At this step, the vacuum deformed the O-ring downward to reduce its projecting height. This deformation is equivalent to moving the mold away from the substrate. It was often observed the mold and the substrate were completely separated at this step. The last step was to raise the top chuck up. This step moved the mold and the substrate away from each other by holding each on respective chucks. Then, the mold and the substrate were unloaded. More than 100 successful separation operations were obtained in the experiment.

Figure 8:
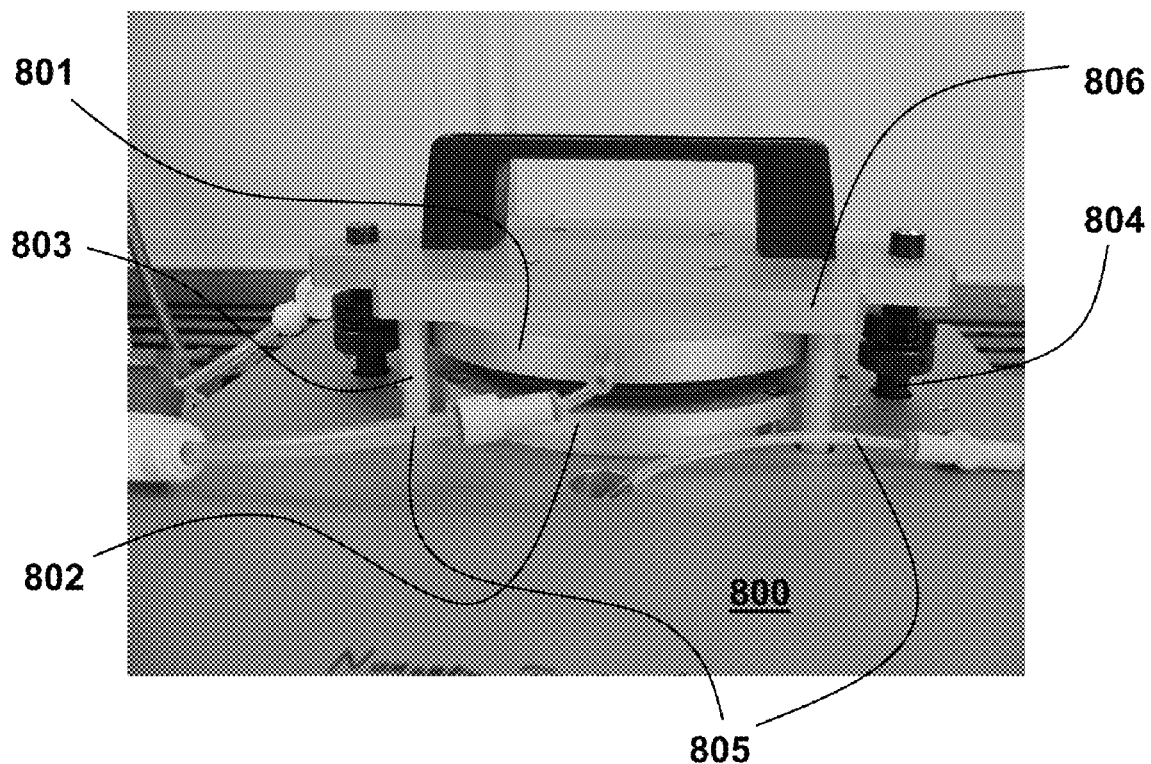
FIG. 8 shows photograph of a separator using the principle of the invention.

FIG. 8 illustrates a stand-alone separator using the method of the invention to separate an assembly of mold and substrate imprinted by an imprinting tool. The apparatus comprises a support plate 806, a top chuck 801, a bottom chuck 802, four pushing rods 803 driven by underlying air actuators (not shown), linear bearing guides 804, pneumatic lines 805, and a base frame 800. Top chuck 801 is attached to support plate 806. Linear bearing guides 804 are connected to corners of the support plate. The guides provide vertical travel guidance to the support plate. Four pushing rods 803 can be retracted to allow the support plate and top chuck assembly to move down. They can also be extended up to push the assembly up. Bottom chuck 802 is attached to base frame 800. Pneumatic lines 805 can be vacuum lines or pressurized gas lines.

Figure 9A:
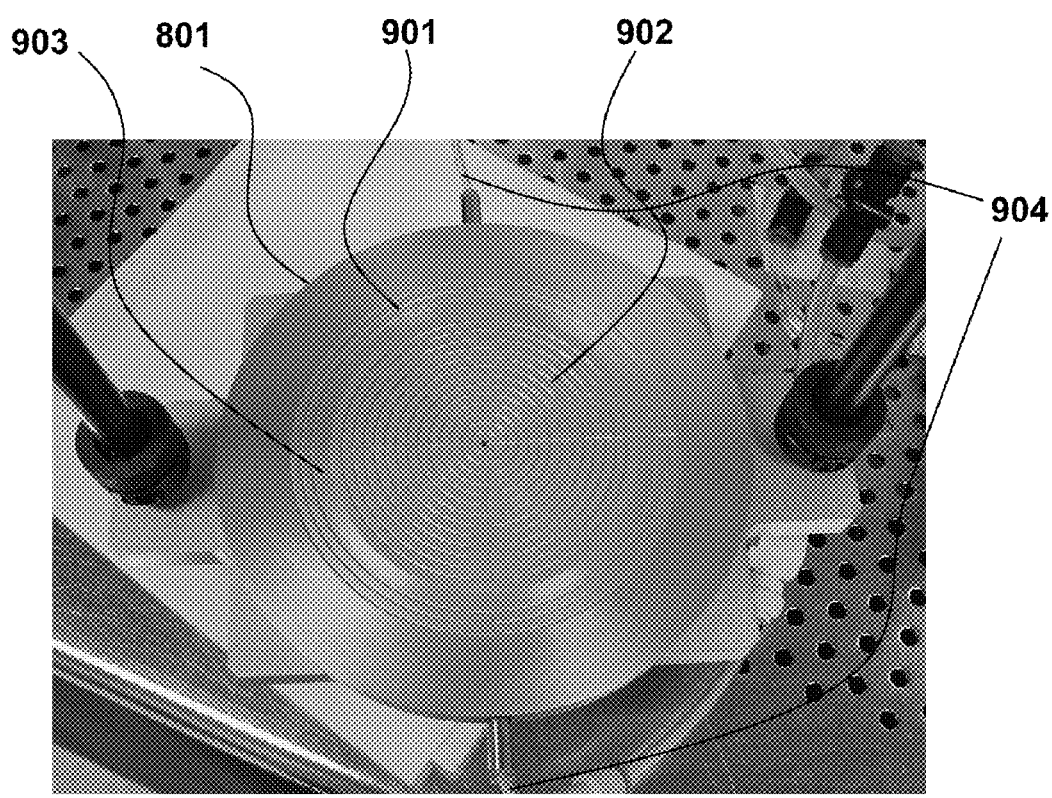
FIGS. 9A, 9B shows photographs of mask/wafer chucks of the separator.

Referring to FIG. 9A, top chuck 801 comprises of a center vacuum groove set 902, a surrounding vacuum groove set 901, and vacuum lines 904 to connect to the groove sets. Vacuum groove set 902 is on an elevated surface higher than vacuum groove set 901. The transition from the center-elevated surface to the surrounding surface is a smooth tapered slope 903 to avoid any sharp edge that might contact the mold or the substrate.

Figure 9B:
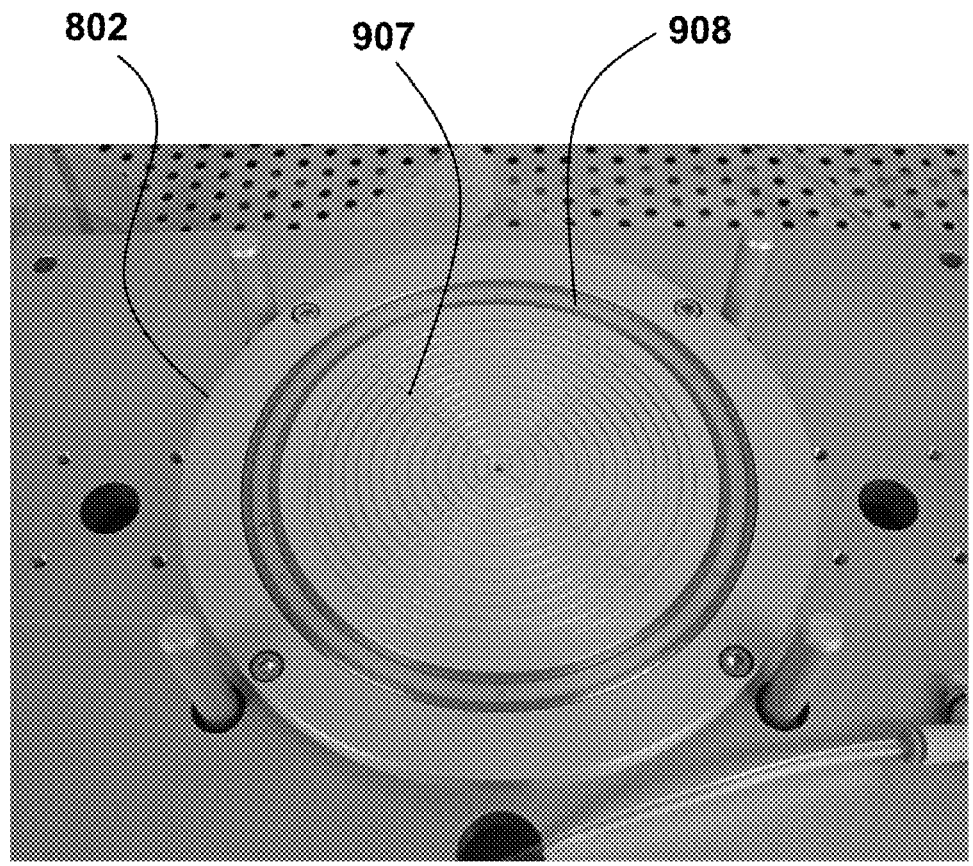

Referring to FIG. 9B, bottom chuck 902 comprises a vacuum groove set 907 and a surrounding inflatable membrane 908. There is pneumatic line (not shown) to connect to the vacuum groove from underneath. The inflatable membrane is composed of a molded elastic membrane and a holding ring support. The inflatable membrane can be extended upward by pressurizing and retracted by depressurizing. Area sizes covered by vacuum groove set 907 and vacuum groove set 902 are designed to be specifically smaller than the laterally smaller of the mold and the substrate.

In operation, the imprinted assembly of mold and substrate is loaded onto the bottom chuck with the smaller one of the mold and substrate contacting the chuck. Then, top chuck is lower down to contact the assembly. Vacuum groove sets 902 and 907 are pumped to apply vacuuming force on the assembly. After loading, the inflatable membrane is pressurized to bend the edge of the laterally larger component of the mold/substrate assembly. The edge of the assembly is separated when sufficient pressure is reached inside the membrane. Surrounding vacuum grove set 901 can be optionally pumped to promote the edge-bending. Then, the top chuck and the bottom chuck are pulled apart relatively vertically to separate the assembly completely. Finally, the separated mold and wafer are unloaded. It was found that the vertically pulling to separate the assembly could be provided by either the pushing rods driven by air actuators or by further pressurizing the membrane.

The stand-alone separator was built to separate a 5" diameter mold and a 4" diameter substrate. Experiments to test the separator used a 5" diameter Si mold with thickness about 0.55 mm. The substrates were 4" diameter Si wafers for thermal imprint and 4" diameter Quartz wafers for UV imprint. Nanonex NXR-1020 resist was used for thermal imprint. Nanonex NXR-2010 was used for UV imprint. The imprinting was performed on Nanonex NX-2000 imprinting Tool. All imprintings were achieved by a pressure of 200 psi. After that, the imprinted assembly was separated on the separator. The experiments successfully performed 10 consecutive separation runs for thermal imprint assembly and 9 consecutive separation runs for UV imprint assembly. The separator was initially tested with manual control, but later was upgraded with a computer automatic control.

In commercial apparatus, the fixtures 500, 501 of FIG. 5 and 600, 601 of FIG. 6 can be actuated to press together the mold and the substrate. Thus the fixtures can be actuated to both imprint and separate at the same station. A controller can automatically direct pressing and separation.

It can now be seen that one aspect of the invention is method of imprinting a substrate having a moldable surface. It comprises providing the substrate and providing a mold having a molding surface to imprint into the moldable surface. The mold is disposed adjacent the substrate with the molding surface adjacent the moldable surface. The molding surface is pressed against the moldable surface to imprint the moldable surface at the mold/substrate interface. The moldable surface is at least partially hardened to retain the imprint. The mold and substrate are than separated by bending distal lateral regions of the mold or the substrate transversely away from the mold/substrate interface. Then the mold and substrate are pulled transversely apart. Advantageously either the mold or the substrate has the greater lateral extent and the separating comprises bending the mold or the substrate having the greater lateral extent. The distal layer regions can be conveniently bent by inflating an inflatable membrane. The substrate and mold can be pulled apart by attaching them to fixtures and transversely displacing the fixtures. The attachment can be by fluid suction.

Another aspect of the invention is apparatus for imprinting a molding surface on a substrate having a moldable surface. The apparatus includes a mold having a molding surface. A positioner can be provided to dispose the mold adjacent the substrate with the molding surface adjacent the moldable surface. Apparatus is provided for pressing the mold against the substrate forming a mold/substrate interface, and apparatus for separating the mold and the substrate comprises means for bending distal lateral regions of the mold or the substrate away from the mold/substrate interface and means for transversely pulling the mold and the substrate apart. The apparatus for bending away advantageously comprises an inflatable membrane, and the means for pulling apart advantageously comprises moveable fixtures attached to the mold and the substrate.

It is to be understood that the above-described embodiments are illustrative of only a few of the many possible specific embodiments which can represent applications of the invention. Numerous and varied other arrangements can be made by those skilled in the art without departing from the spirit and scope of the invention.

The invention claimed is:

1. An apparatus for imprinting a mold having a molding surface on a substrate having a moldable surface comprising in operative relationship:
   a means for positioning the mold adjacent the substrate, with the molding surface adjacent the moldable surface, wherein at least a portion of a distal lateral region of either the mold or the substrate substantially extends beyond the periphery of the other one of the mold and the substrate;
   a means for pressing the mold against the substrate to form a mold/substrate interface between the molding surface and the moldable surface;
   a means for bending said portion of the distal lateral region of either the mold or the substrate away from the mold/substrate interface; and
   a means for transversely pulling the mold and the substrate apart.

2. An apparatus for imprinting a mold, having a molding surface, on a substrate having a moldable surface, comprising:
- a means for positioning the mold adjacent the substrate, with the molding surface of the mold adjacent to the moldable surface of the substrate, wherein at least portion of a distal lateral region of either the mold or the substrate substantially extends beyond the periphery of the other one of the mold and the substrate, and for pressing the mold against the substrate to form a mold/substrate interface between the molding surface and the moldable surface;
- a first holding fixture for holding a side, other than the mold/substrate interface, of either the mold or the substrate having said extended portion of the distal lateral region;
- a second holding fixture for holding a side, other than the mold/substrate interface, of the mold or substrate not held by said first holding fixture;
- an actuator for bending said extended portion of the distal lateral region transversely toward said first holding fixture;
- a positioner for adjusting the transverse distance between said first holding fixture and said second holding fixture;
- a body defining a base frame;
- wherein said positioner is connected to a support frame for acutation relative to said base frame;
- wherein one of said first and second holding fixtures is connected to said base frame and the other of said first and second holding fixtures connected to said support frame; and
- wherein said actuator includes an action portion adjacent to said extended portion of the distal lateral region, and a non-action portion connected to said body directly or indirectly through one of said holding fixtures or through said positioner.

3. The apparatus of claim 2 wherein said actuator comprises an inflatable membrane that can be pressurized.

4. The apparatus of claim 2 wherein at least one of said first and second holding fixtures comprises a plurality of surface grooves for fluid suction holding.

5. The apparatus of claim 2 wherein said first holding fixture comprises a plurality of surface grooves for fluid suction holding not extending into the surface region corresponding to said extended portion of the lateral distal region.

6. The apparatus of claim 2 wherein said first holding fixture comprises:
- a flat central surface having a plurality of surface grooves for fluid suction holding; and
- a recessed outer surface adjacent to a periphery of said flat central surface for limiting bending of said extended portion by said actuator.

7. The apparatus of claim 6 wherein said surface grooves extend adjacent to a periphery of said flat central surface as much as maximally permitted to achieving effective fluid suction holding.

8. The apparatus of claim 6 wherein said recessed outer surface encloses said flat central surface.

9. The apparatus of claim 6 wherein said recessed outer surface includes a plurality of surface grooves for fluid suction to facilitate bending of said extended portion by said actuator.

10. The Apparatus of claim 6 wherein said first holding fixture further includes a transition surface connecting said flat central surface and said recessed outer surface to avoid abrupt surface change thereof.

11. A separator for separating a mold from a moldable surface on a substrate wherein said mold has been pressed into said moldable surface by imprinting and either the mold or the substrate has a greater lateral extent than the other, the separator comprising:
- a first holding fixture for holding the mold or the substrate having the lesser lateral extent;
- a second holding fixture for holding the mold or the substrate having the greater lateral extent;
- an actuator for bending a portion of the mold or substrate having said greater lateral extent;
- a motion controller for controlling relative transverse movement between said first and second holding fixtures;
- a base frame;
- wherein a fixed portion of said motion controller is connected to said base frame and a movable portion of said motion controller is connected to a support plate;
- wherein one of said holding fixtures is connected to said base frame and the other of said holding fixtures is connected to said support plate for transverse movement relative to said base frame and said one holding fixture;
- wherein said actuator includes an action portion adjacent to said greater lateral extent of said mold or substrate, and a non-action portion connected either directly to said base or indirectly to said base through one of said holding fixtures or through said motion controller.

12. The separator of claim 11 wherein said actuator comprises an inflatable membrane that can be pressurized.

13. The separator of claim 11 wherein said first holding fixture comprises a surface having a plurality of central surface grooves for fluid suction holding.

14. The separator of claim 13 wherein said surface grooves extend adjacent to a periphery of the mold or the substrate held by said first holding fixture.

15. The separator of claim 13 wherein said actuator is an inflatable membrane ring located on said surface and enclosing said central surface grooves.

16. The separator of claim 11 wherein said second holding fixture comprises:
- a flat central surface having a plurality of surface grooves for fluid suction holding; and
- a recessed outer surface about a periphery of said central surface for limiting the bending made by said actuator.

17. The separator of claim 16 wherein said surface grooves extend adjacent to the periphery of said central surface as much as maximally permitted by achieving effective fluid suction holding.

18. The separator of claim 16 wherein said recessed outer surface comprises a plurality of surface grooves for fluid suction to facilitate the bending made by said actuator.

19. The separator of claim 16 wherein said recessed outer surface is smoothly connected to said flat central surface to avoid a sharp edge in between.

20. The separator of claim 19 wherein said recessed outer surface peripherally surrounds said central surface.

* * * * *